(12) United States Patent
Huang et al.

(10) Patent No.: US 7,615,826 B2
(45) Date of Patent: Nov. 10, 2009

(54) ELECTROSTATIC DISCHARGE PROTECTION SEMICONDUCTOR STRUCTURE

(75) Inventors: Chih-Feng Huang, Hsinchu County (TW); Tuo-Hsin Chien, Taipei County (TW); Jenn-Yu G. Lin, Taipei Hsien (TW); Ta-yung Yang, Milpitas, CA (US)

(73) Assignee: System General Corp., Taipei Hsien (TW)

( * ) Notice: Subject to any disclaimer, the term of this patent is extended or adjusted under 35 U.S.C. 154(b) by 400 days.

(21) Appl. No.: 11/427,773

(22) Filed: Jun. 29, 2006

(65) Prior Publication Data

US 2007/0004150 A1   Jan. 4, 2007

(30) Foreign Application Priority Data

Jul. 4, 2005   (CN)   ................ 2005 1 0082018

(51) Int. Cl.
*H01L 23/62* (2006.01)
(52) U.S. Cl. .................. 257/355; 257/356; 257/361; 257/362; 257/E29.014; 257/E29.063
(58) Field of Classification Search .......... 257/355, 257/356, 361, 362
See application file for complete search history.

(56) References Cited

U.S. PATENT DOCUMENTS 7,417,287 B2 *   8/2008   Huang et al. ............... 257/355

* cited by examiner

*Primary Examiner*—Hsien-ming Lee
(74) *Attorney, Agent, or Firm*—Jianq Chyun IP Office

(57) ABSTRACT

An electrostatic discharge (ESD) protection device with adjustable single-trigger or multi-trigger voltage is provided. The semiconductor structure has multi-stage protection semiconductor circuit function and adjustable discharge capacity. The single-trigger or multi-trigger semiconductor structure may be fabricated by using the conventional semiconductor process, and can be applied to IC semiconductor design and to effectively protect the important semiconductor devices and to prevent the semiconductor devices from ESD damage. In particular, the present invention can meet the requirements of high power semiconductor device and has better protection function compared to conventional ESD protection circuit. In the present invention, a plurality of N-wells or P-wells connected in parallel are used to adjust the discharge capacity of various wells in the P-substrate so as to improve the ESD protection capability and meet different power standards.

12 Claims, 3 Drawing Sheets

US 7,615,826 B2

ELECTROSTATIC DISCHARGE PROTECTION SEMICONDUCTOR STRUCTURE

CROSS-REFERENCE TO RELATED APPLICATION

This application claims the priority benefit of China application serial no. 200510082018.1, filed on Jul. 4, 2005. All disclosure of the China application is incorporated herein by reference.

BACKGROUND OF THE INVENTION

1. Field of the Invention

The present invention relates to an electrostatic discharge (ESD) protection semiconductor structure. More particularly, the present invention relates to a ESD protection semiconductor structure with adjustable multi-trigger or single-trigger voltage, which has improved ESD protection capability and can meet different power standards by adjusting the discharge capacities of a plurality of N-wells or P-wells in P-substrate and connecting the N-wells or P-wells in parallel, and which demonstrates better performance than the performance of the conventional ESD protection semiconductor structure.

2. Description of Related Art

ESD protection circuits are used especially for ESD protection in ICs. When the power in the ESD protection circuits keeps increasing and the ESD protection device reaches the secondary breakdown voltage after reaching the first breakdown voltage, the ESD protection device or the ESD protection function thereof may be damaged due to the high voltage or current.

The secondary breakdown voltage is usually dominated by the breakdown voltage of the PN interface of a bipolar junction transistor (BJT) is used as the ESD protection device, that means, after the first breakdown, if the power in the ESD protection circuit keeps increasing, the increases of voltage and current through the device will trigger the secondary breakdown voltage first, which causes damage to the device.

Accordingly, a semiconductor structure serving as the ESD protection device to prevent from reaching secondary breakdown can meet the requirement of practical application.

SUMMARY OF THE INVENTION

Accordingly, the present invention is directed to a semiconductor structure comprising multi-trigger function and capable of serving as an electrostatic discharge (ESD) protection device. The semiconductor structure is capable of prolonging an electrostatic discharge from reaching secondary breakdown when a high current passes through the semiconductor structure.

To achieve the aforementioned objectives, the present invention provides a semiconductor structure, which has improved ESD protection capability and can meet different power standards by adjusting the discharge capacities of a plurality of N-wells or P-wells in P-substrate and connecting the N-wells or P-wells in parallel. The present invention is developed by integrating the conventional semiconductor manufacturing process, for example, CMOS logic process or high voltage process.

According to an embodiment of the present invention, a structure with a plurality of ESD protection devices including a second type ion doped layer is provided. The ESD protection device includes: a first type ion doped well disposed in the second type ion doped layer; a first first-type ion heavily doped region disposed in the second type ion doped layer and separated from the first type ion doped well and other regions in the second type ion doped layer; a second type heavily doped region disposed in the second type ion doped layer and separated from the first type ion doped well and other regions in the second type ion doped layer; a first electrode, connected to the first first-type ion heavily doped diffusion region and the second type ion heavily doped diffusion region; a second electrode; and a plurality of second first-type ion heavily doped regions disposed in the first type ion doped well, wherein a distance is adjustable between the second first-type ion heavily doped region closest to the boundary of the first type ion doped well and the boundary of the first type ion doped well, and the other second first-type ion heavily doped regions are connected with each other by contacting the second electrode.

The present invention can also be implemented with a single ESD protection device including: a second type ion doped layer; a first-type ion doped well disposed in the second type ion doped layer; a first first-type ion heavily doped region disposed in the second type ion doped layer and separated from the first type ion doped well and other regions in the second type ion doped layer; a second type ion heavily doped region disposed in the second type ion doped layer and separated from the first type ion doped well and other regions in the second type ion doped layer; a first electrode, connected to the first first-type ion heavily doped diffusion region and the second type ion heavily doped diffusion region; and there is at least one second first-type ion heavily doped region disposed in the first type ion doped well, wherein a distance is adjustable between the second first-type ion heavily doped region closest to the boundary of the first type ion doped well and the boundary of the first type ion doped well, and the other second first-type ion heavily doped regions are connected with each other by contacting the second electrode.

In order to the make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
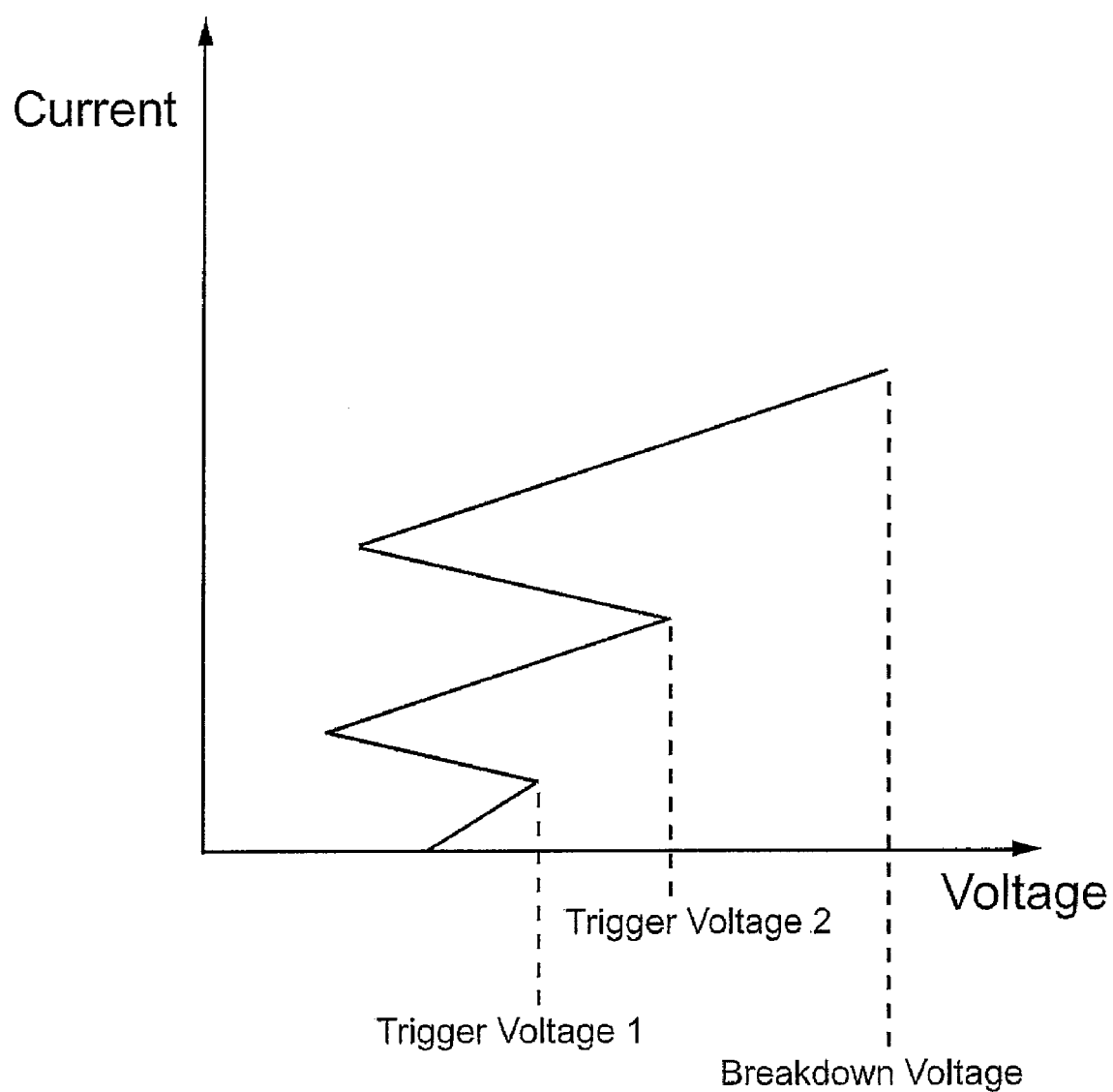
FIG. 1 is the current-voltage characteristic of the present invention.
Figure 2:
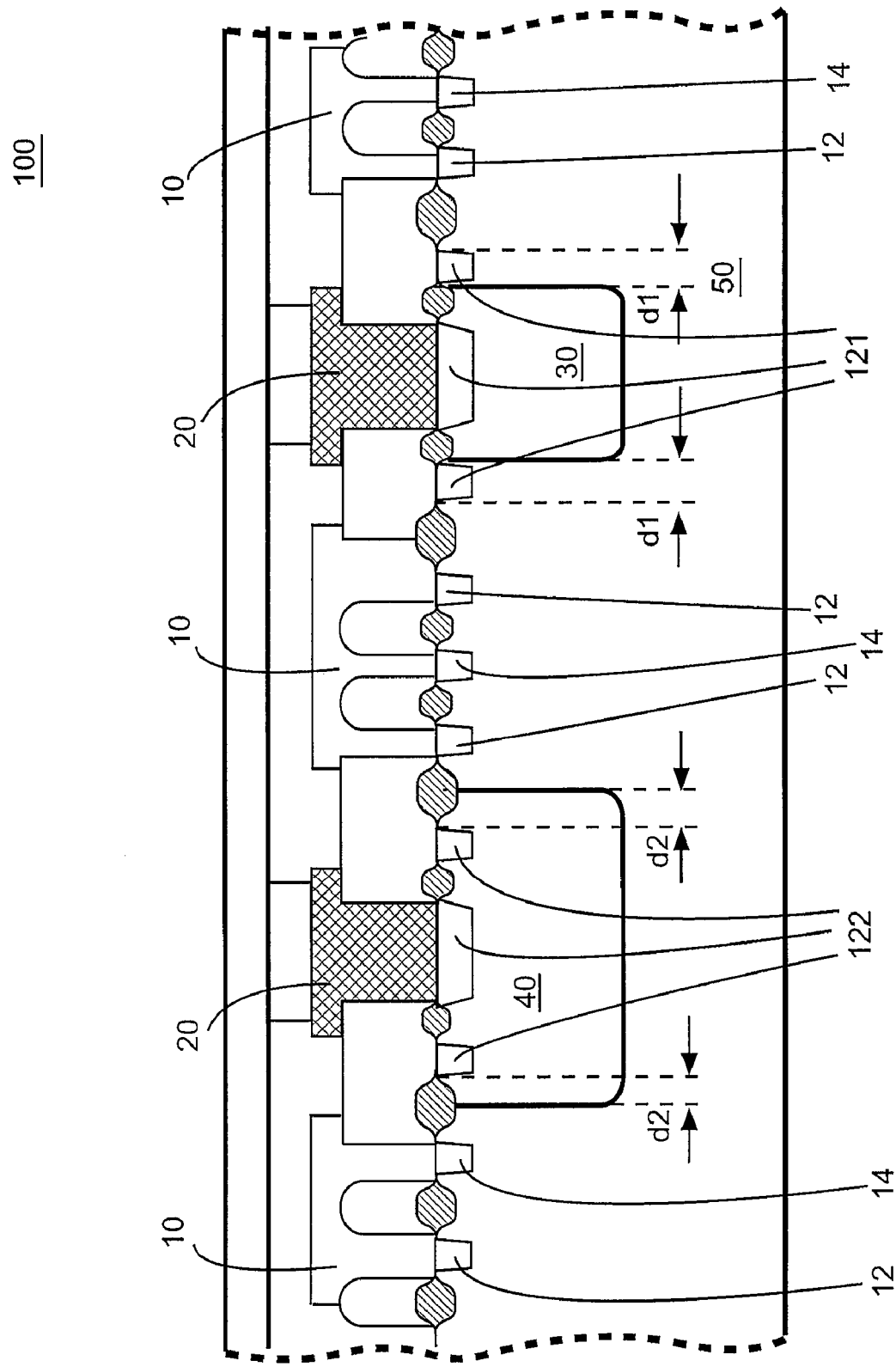
FIG. 2 is a diagram of a multi-trigger ESD protection semiconductor structure according to an embodiment of the present invention.
Figure 3:
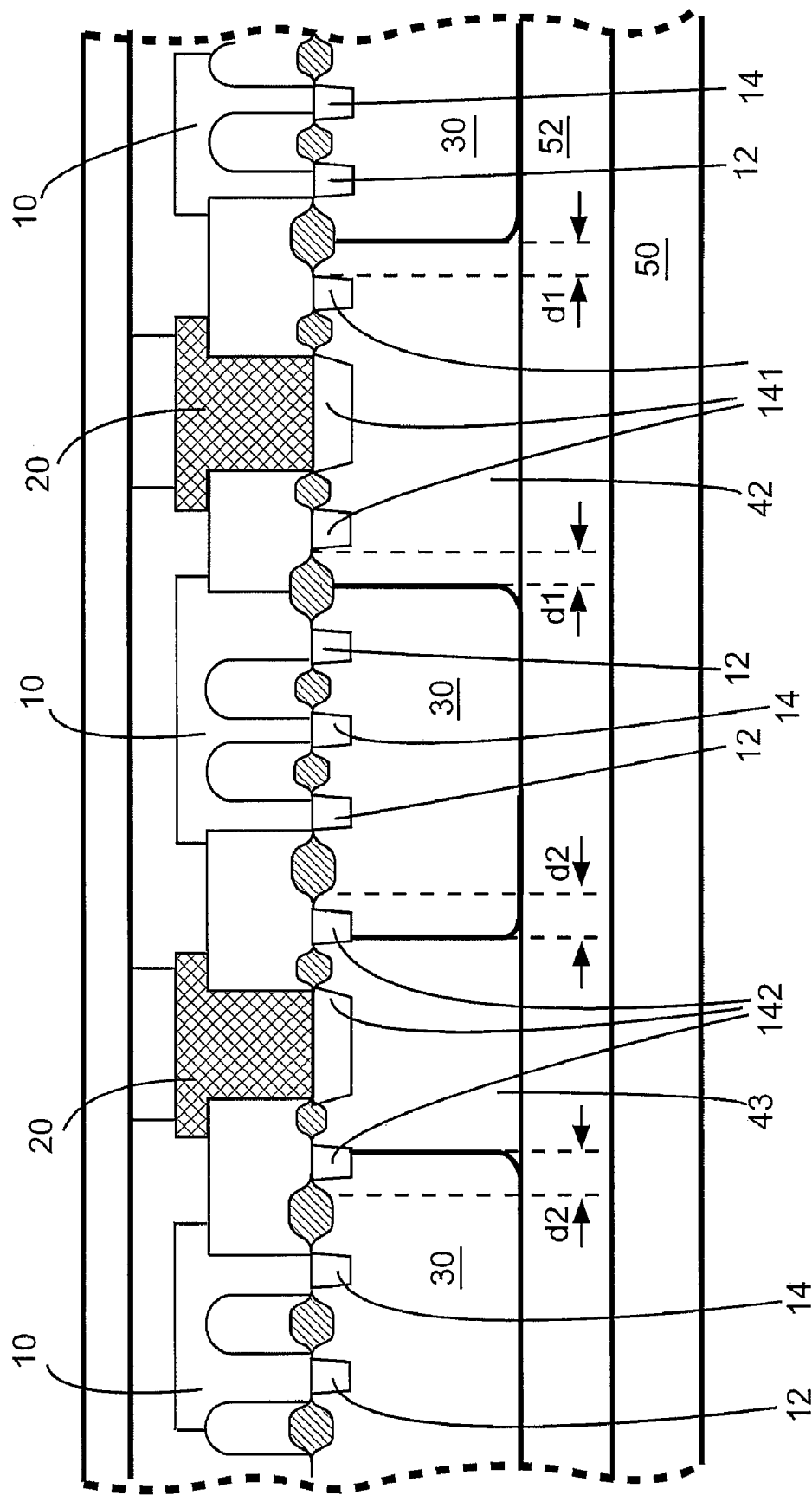
FIG. 3 is a diagram of a multi-trigger ESD protection semiconductor structure according to another embodiment of the present invention.

FIG. 1 is the current-voltage characteristic diagram of the invention. FIGS. 2~3 are diagrams illustrating the embodiments of the present invention, wherein a plurality of N-wells or P-wells are used to form a particular impedance corresponding to a particular voltage in the P-substrate so as to form an adjustable trigger voltage, and to connect various wells in parallel and make the discharge capacities of various wells to be adjustable, so as to form the multi-trigger ESD protection semiconductor structure.

Referring to the embodiments of the present invention as shown in FIG. 2 and FIG. 3, wherein the embodiment in FIG. 2 includes: a P-substrate 50 having a plurality of ESD protection devices formed thereon (the semiconductor can be implemented with logic device or optoelectronic device, such as transistors or MOS and CMOS devices used for power protection); a first N-well 30 (can be more than one such that a second N-well 40 may be of different impedance) disposed at one side of the P-substrate 50; a first N+ diffusion region 12 disposed laterally adjacent to the first N-well 30 by a predetermined N+ isolation distance at one side of the P-substrate 50, wherein the predetermined lateral N+ isolation distance is distributed over at least one oxide region (the oxide region can be more than one, i.e. the diagonal blocks shown in the figure); a first P+ diffusion region 14 disposed laterally adjacent to the first N-well 30 by a predetermined lateral P+ isolation distance at one side of the P-substrate 50, wherein the predetermined lateral P+ isolation distance is distributed over at least one oxide region and isolating the first N+ diffusion region 12 with at least one oxide region; a first electrode 10 (can be Vss ground terminal), connected to the first N+ diffusion region 12 and the first P+ diffusion region 14, wherein the first electrode is comprised of a conductive material; a second electrode 20 (can be Vdd voltage terminal), isolating the first electrode 10 with at least one oxide region; and a plurality of second N+ diffusion regions 121 or 122 disposed in the first N-well 30 or partially spanning over the boundary of the first N-well 30, wherein the second N+ diffusion regions 121 or 122 laterally isolates at least one oxide region and connected to the second electrode 20. Wherein at least one second N+ diffusion region 121 or 122 is located at the peripheral area of the first N-well 30 and at an adjustable lateral distance (can be d1 or d2) from the boundary of the first N-well 30 so as to adjust the discharge capacity; wherein more than one first N-well 30 and one second N-well 40 with different impedance may be connected in parallel (can be 3, 5, or more stages to form a plurality of breakdown voltages) and are further connected to the second electrode 20 through the second N+ diffusion regions 121 or 122 in parallel. The first N-wells 30 are located in a semiconductor ESD protection circuit (can be a general chip formed with other semiconductor devices) or in an ESD protection device.

Referring to the FIG. 1 and FIG. 2. The N+ diffusion regions 122 (can be more than one) may be located in the N-well 40 to form a structure of high voltage trigger silicon-controlled rectifier. The N+ diffusion regions 121 is partially located in the N-well 30 and span over the boundaries of the N-well 30 and the P-substrate 50 to form a structure of low voltage trigger silicon-controlled rectifier. The adjustable lateral distance dl between the boundary of the N-well 30 and the boundary of the N+diffusion region 121 close to the boundary of the N-well 30 can be adjusted, and the adjustable lateral distance d2 between the boundary of the N-well 40 and the boundary of the N+ diffusion region 122 close to the boundary of the N-well 40 can be adjusted, so as to form a multi-trigger ESD protection structure. One skilled in the art would understand that the distance d1 may be increased to reduce the volume of N-well 30 under the N+ diffusion region 121 and thereby decrease the Trigger Voltage 1, or the distance d1 may be decreased to enlarge the volume of N-well 30 under the N+ diffusion region 121 and thereby increase the Trigger Voltage 1. Furthermore, one skilled in the art would also understand that the distance d2 may be increased to enlarge the volume of N-well 40 under the N+ diffusion region 122 and thereby increase the Trigger Voltage 2, or the distance d2 may be decreased to reduce the volume of N-well 40 under the N+diffusion region 122 and thereby decrease the Trigger Voltage 2. A conductive connection pad is disposed at the boundary of the disposition region of the multi-trigger ESD protection structure. The conductive connection pad is connected to the first electrode 10 or the second electrode 20 to form a voltage supplying terminal or a ground terminal.

FIG. 3 is a diagram of a multi-trigger ESD protection semiconductor structure according to another embodiment of the present invention. The multi-trigger ESD protection semiconductor structure includes a P-substrate 50; a N-type buried layer 52 (to mainly form N-type impedance) disposed in the P-substrate 50 at a predetermined depth. Wherein each of the ESD protection device includes a first N-well 30 disposed above the N-type buried layer 52; a P-well 42 and a P-well 43 disposed above the N-type buried layer 52 adjacent to the first N-well 30; a first N+ diffusion region 12 disposed at one side of the first N-well 30 at a predetermined lateral N+ isolation distance from the P-well 42 and the P-well 43, the predetermined lateral N+ isolation distance being distributed over at least one oxide region; a first P+ diffusion region 14 disposed at one side of the first N-well 30 at a predetermined lateral P+ isolation distance from the first P-well 42, the predetermined lateral P+ isolation distance being distributed over at least one oxide region and isolating the first N+ diffusion region 12 with at least one oxide region; a first electrode 10 comprised of a conductive material connected the first N+ diffusion region 12 and the first P+ diffusion region 14; a second electrode 20, isolating the first electrode 10 with at least one oxide region; a plurality of second P+ diffusion regions 141 or 142 (can be more than one), disposed in the P-well 42 or partially spanning over the boundary of the P-well 43, wherein each second P+ diffusion region 141 or 142 laterally isolates at least one oxide region, and at least one second P+ diffusion region 141 or 142 is connected to the second electrode 20; at least one of the second P+ diffusion regions 141 or 142 is located in the marginal area of the P-well 42 or the P-well 43 and is an adjustable lateral distance (can be d1 or d2) from the boundary of the P-well 42 so as to adjust the discharge capacity; a plurality of the P-wells 42 are electrically connected with each other and are connected to the second electrode 20 through the second P+ diffusion regions 141 or 142 in parallel, and the P-wells 42 are located in the semiconductor ESD protection circuit or in a ESD protection device.

Referring to the FIG. 1 and FIG. 3. The P+ diffusion regions 141 are located in the P-well 42 to form a structure of high voltage trigger silicon-controlled rectifier. The P+ diffusion regions 142 are located in the P-well 43 partially and span over the boundaries of the P-well 43 and the N-well 30 to form a structure of low voltage trigger silicon-controlled rectifier. The adjustable lateral distance d1 between the boundary of the P-well 42 and the boundary of the P+ diffusion region 141 close to the boundary of the P-well 42 can be adjusted, and the adjustable lateral distance d2 between the boundary of the P-well 43 and the boundary of the P+ diffusion region 142 close to the boundary of the P-well 43 can be adjusted, so as to form the multi-trigger ESD protection semiconductor structure. One skilled in the art would understand that the distance d1 may be increased to enlarge the volume of the P-well 42 under P+ diffusion region 141 and thereby increase the Trigger Voltage 2, or the distance d1 may be decreased to reduce the volume of the P-well 42 under P+ diffusion region 141 and thereby decrease the Trigger Voltage 2. Also, one skilled in the art would understand that the distance d2 may be increased to reduce the volume of the P-well 43 under P+ diffusion region 142 and thereby decrease the Trigger Voltage 1, or the distance d2 may be decreased to enlarge the volume of the P-well 43 under P+ diffusion region 142 and thereby increase the Trigger Voltage 1. A conductive connection pad disposed at the boundary of the disposition region of the multi-trigger ESD protection semiconductor structure and is connected to the first electrode 10 or the second electrode 20 so as to form a voltage supplying terminal or a ground terminal.

The present invention can be implemented in a multiple ESD protection devices mode or single ESD protection device mode, the structure thereof in FIG. 2 and FIG. 3 includes a second type ion doped layer (i.e. can be the device of the P-substrate 50 or the device of the N-type buried layer 52) comprising a plurality of ESD protection devices formed thereon (or a single ESD protection device), each of the ESD protection device includes a first type ion doped well (can be the device of the first N-well 30 or the device of the first P-well 42, i.e. well formation impedance having opposite polarity compared to that of the substrate or the buried layer) disposed in the second type ion doped layer (i.e. on the substrate or the buried layer); a first first-type ion heavily doped region (i.e. the first N+ diffusion region 12 or the first P+ diffusion region 14) disposed in the second type ion doped layer (i.e. on the substrate or the buried layer), separated from the first type ion doped well (i.e. the well having opposite polarity on the substrate or the buried layer) and other regions in the second type ion doped layer (the bottom region of the substrate or the buried layer); a second type ion heavily doped (i.e. the first N+ diffusion region 12 or the first P+ diffusion region 14) disposed in the second type ion doped layer (i.e. on the substrate or the buried layer), separated from the first type ion doped well (i.e. the well having opposite polarity compared to that of the substrate or the buried layer) and other regions in the second type ion doped layer (i.e. the bottom region of the substrate or the buried layer); a first electrode 10 (can be Vss ground terminal), connecting the first first-type ion heavily doped diffusion region (i.e. the first N+ diffusion region 12 or the first P+ diffusion region 14) and the second type ion heavily doped diffusion region (i.e. the first N+ diffusion region 12 or the first P+ diffusion region 14); a second electrode 20 (can be Vdd voltage terminal); and a plurality of (or at least one) second first-type ion heavily doped regions (i.e. the second N+ diffusion regions 121 or 122, or the second P+ diffusion regions 141 or 142) disposed in the first type ion doped well (i.e. the well of opposite polarity on the substrate or the buried layer), wherein an adjustable distance (d1 or d2) is maintained between the second first-type ion heavily doped region which is the closest to the boundary of the first type ion doped well and the boundary of the first type ion doped well, and other second first-type ion heavily doped regions are connected to each other by contacting the second electrode.

Referring to the common structure of the embodiments in FIGS. 2 and 3, the following differences are included: the first type ion can be N-type ion or P-type ion, and the second type ion corresponds to the first type ion to be P-type ion or N-type ion, which means the first type ion and the second type ion have opposite polarities; the second first-type ion heavily doped region which is the closest to the boundary of the first type ion doped well is located in the first type ion doped well, here the distance between the boundary of the second first-type ion heavily doped region closest to the boundary of the first type ion doped well and the boundary of the first type ion doped well is positive, and the longer the distance, the higher the trigger voltage of the ESD protection device demonstrates; the second first-type ion heavily doped region which is the closest to the boundary of the first type ion doped well is partially located in the first type ion doped well and spans over the boundary of the first type ion doped well, here the distance between boundary of the second first-type ion heavily doped region which is the closest to the boundary of the first type ion doped well and the boundary of the first type ion doped well is negative, and the longer the distance, the lower the trigger voltage of the ESD protection device. The semiconductor structure with multi-trigger voltages is achieved by adjusting the distance between the boundary of the second first-type ion heavily doped region closest to the boundary of the first type ion doped well and the boundary of the first type ion doped well. Furthermore, a pad is disposed on the semiconductor structure for connecting to the first electrode or the second electrode through a conductor. The first electrode or the second electrode which is not connected to the pad may be connected to a voltage or the ground.

According to an embodiment of the present invention, the dosage concentration of the first type ion doped well (N-well or P-well) is about 1E12-3E13(ions/cm$^2$), the dosage concentration range of the first type ion heavily doped diffusion region and the second type ion heavily doped diffusion region (P+ diffusion region or N+ diffusion region) is about 1E15-2E16 (ions/cm$^2$), and the thickness of the oxide region is 2000-10000A (1000 A is equal to 0.1 μcm).

According to the present invention, the conventional single-trigger ESD protection semiconductor structure is modified into multi-trigger ESD protection semiconductor structure of adjustable single-trigger ESD protection semiconductor structure, wherein a plurality of N-wells or P-wells are used to form a particular impedance corresponding to a particular voltage in the P-substrate so as to form breakdown discharge current power, and various wells are connected in parallel and the discharge capacities of various wells are made adjustable, so as to form the multi-trigger ESD protection semiconductor structure. An external circuit interface junction, for example, welding pad, is disposed in a small electric device or a particular region in a large chip to improve the convenience in installing the structure of the present invention and the protection capability thereof. Since the conventional fabrication process, and therefore the fabrication cost can be effectively reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge (ESD) protection semiconductor structure with adjustable multi-trigger voltage, comprising:

a second type ion-doped layer with a plurality of ESD protection devices formed thereon, each of the ESD protection devices comprising:

a first type ion-doped well, disposed in the second type ion doped layer;

a first first-type ion heavily doped region, disposed in the second type ion doped layer, formed separately from the first type ion doped well;

a second type ion heavily doped region, disposed in the second type ion doped layer, formed separately from the first type ion doped well;

a first electrode, connected to the first first-type ion heavily doped region and the second type ion heavily doped region;

a second electrode;

a plurality of second first-type ion heavily doped region, disposed in the first type ion doped well and next to a boundary of the first type ion doped well, wherein a distance between an edge of one of the plurality of the second first-type ion heavily doped region, which is the closest to the boundary of the first type ion doped well, and the boundary of the first type ion doped well is adjustable; and a plurality of third first-type ion heavily doped region, disposed in the first type ion doped well between the second first-type ion heavily doped regions, wherein the third first-type ion heavily doped regions are connected to the second electrode respectively.

2. The ESD protection semiconductor structure with adjustable multi-trigger voltage as claimed in claim 1, wherein the first type ion is different from the second type ion.

3. The ESD protection semiconductor structure with adjustable multi-trigger voltage as claimed in claim 1, wherein the second first-type ion heavily doped region closest to the boundary of the first type ion doped well is located in the first type ion doped well, wherein a distance between the edge of the second first-type ion heavily doped region closest to the boundary of the first type ion doped well and the boundary of the first type ion doped well is positive, and wherein the longer the distance, the higher the trigger voltage of the ESD protection device.

4. The ESD protection semiconductor structure with adjustable multi-trigger voltage as claimed in claim 1, wherein the second first-type ion heavily doped region closest to the boundary of the first type ion doped well is located in the first type ion doped well partially and spans over the boundary of the first type ion doped well, wherein a distance between the edge of the second first-type ion heavily doped region closest to the boundary of the first type ion doped well and the boundary of the first type ion doped well is negative, and wherein the longer the distance, the lower the trigger voltage of the ESD protection device.

5. The ESD protection semiconductor structure with adjustable multi-trigger voltage as claimed in claim 1, wherein the semiconductor structure with multi-trigger voltages is achieved by adjusting a distance between the edge of the second first-type ion heavily doped region which is the closest to the boundary of the first type ion doped well and the boundary of the first type ion doped well.

6. The ESD protection semiconductor structure with adjustable multi-trigger voltage as claimed in claim 1, further comprising a pad disposed above the semiconductor structure and connected to the first electrode or the second electrode through a conductor, wherein the first electrode or the second electrode which is not connected to the pad is connected to a voltage or ground.

7. The ESD protection semiconductor structure with adjustable multi-trigger voltage as claimed in claim 1, wherein a dosage concentration of the first type ion doped well is 1E12-3E13 (ions/cm$^2$), and a dosage concentration of the first type ion heavily doped region and the second type ion heavily doped region is 1E15-2E16 (ions/cm$^2$).

8. An electrostatic discharge (ESD) protection semiconductor structure with adjustable single-trigger voltage, comprising:

a second type ion doped layer;

a first type ion doped well, disposed in the second type ion doped layer;

a first first-type ion heavily doped region, disposed in the second type ion doped layer, is separated from the first type ion doped well;

a second type ion heavily doped region, disposed in the second type ion doped layer, is separated from the first type ion doped well;

a first electrode, connecting the first first-type ion heavily doped region and the second type ion heavily doped region;

a second electrode;

at least a second first-type ion heavily doped region, disposed in the first type ion doped well, wherein an adjustable distance is maintained between an edge of the second first-type ion heavily doped region which is the closest to the boundary of the first-type ion doped well and the boundary of the first-type ion doped well; and a least a third first-type ion heavily doped region, disposed in the first type ion doped well between the second first-type ion heavily doped regions, wherein the third first-type ion heavily doped regions are connected to contacting the second electrode respectively.

9. The ESD protection semiconductor structure with adjustable single-trigger voltage as claimed in claim 8, wherein the first type ion is complementary to the second type ion.

10. The ESD protection semiconductor structure with adjustable single-trigger voltage as claimed in claim 8, wherein when the second first-type ion heavily doped region is located in the first type ion doped well, a first distance between the edge of the second first-type ion heavily doped region which is the closest to the boundary of the first type ion doped well and the boundary of the first type ion doped well is positive, and the longer the first distance, the higher the trigger voltage of the ESD protection semiconductor structure; when the second first-type ion heavily doped region spans over the boundary of the first type ion doped well, a second distance between the edge of the second first-type ion heavily doped region and the boundary of the first type ion doped well is negative, and the longer the second distance, the lower the trigger voltage of the ESD protection semiconductor structure.

11. The ESD protection semiconductor structure with adjustable single-trigger voltage as claimed in claim 8, wherein the at least a second first-type ion heavily doped region represents a plurality of second first-type ion heavily doped regions, wherein a distance is maintained between the edge of the at least a second first-type ion heavily doped region-which is the closest to the boundary of the first type ion doped well and the boundary of the first type ion doped well, and the remaining second first-type ion heavily doped regions are connected to the second electrode respectively.

12. The ESD protection semiconductor structure with adjustable single-trigger voltage as claimed in claim 8, wherein a dosage concentration of the first type ion doped well is 1E12-3E13 (ions/cm$^2$), and a dosage concentration of the first type ion heavily doped diffusion region and the second type ion heavily doped diffusion region is 1E15-2E16 (ions/cm$^2$).

* * * * *